(12) United States Patent
Zhu

(10) Patent No.: US 12,580,420 B1
(45) Date of Patent: ***Mar. 17, 2026

(54) WIRELESS CHARGING POWER BANK

(71) Applicant: Guangdong Aoyun Technology Co., Ltd., Huizhou (CN)

(72) Inventor: Xueping Zhu, Huizhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/204,661

(22) Filed: May 12, 2025

Related U.S. Application Data

(63) Continuation-in-part of application No. 19/006,894, filed on Dec. 31, 2024, now Pat. No. 12,302,534.

(30) Foreign Application Priority Data

Dec. 23, 2024 (CN) .......................... 202423187014.7

(51) Int. Cl.
| | |
|---|---|
| *H02J 50/00* | (2016.01) |
| *H02J 50/10* | (2016.01) |
| *H05K 7/20* | (2006.01) |
| *H02J 7/00* | (2006.01) |

(52) U.S. Cl.
CPC ............ *H02J 50/005* (2020.01); *H02J 50/10* (2016.02); *H05K 7/209* (2013.01); *H02J 7/0047* (2013.01)

(58) Field of Classification Search
CPC ................................................. H02J 50/005
USPC ....................................................... 320/108
See application file for complete search history.

(56) References Cited

U.S. PATENT DOCUMENTS

| | | | | |
|---|---|---|---|---|
| 8,537,528 | B2* | 9/2013 | Lee ...................... | H04M 1/0262 |
| | | | | 361/679.01 |
| 2010/0181842 | A1* | 7/2010 | Suzuki .................... | H01F 38/14 |
| | | | | 307/104 |
| 2011/0155595 | A1* | 6/2011 | Holford ............. | B65D 85/1036 |
| | | | | 206/242 |
| 2019/0221353 | A1* | 7/2019 | Hwang ................... | H02J 50/10 |
| 2023/0187728 | A1* | 6/2023 | Jang .................. | H01M 10/6568 |
| | | | | 429/120 |
| 2023/0404796 | A1* | 12/2023 | Zhu .......................... | A61F 7/007 |
| 2024/0015923 | A1* | 1/2024 | Zeng .................. | H05K 7/20154 |

FOREIGN PATENT DOCUMENTS

| | | | | | |
|---|---|---|---|---|---|
| CN | 114362316 | A | * | 4/2022 | |
| CN | 217608193 | U | * | 10/2022 | |
| CN | 220440396 | U | * | 2/2024 | ............. H02J 50/10 |

* cited by examiner

*Primary Examiner* — Ahmed H Omar

(57) ABSTRACT

A wireless charging power bank includes a shell, a heat, a battery and a coil. The battery is installed on the shell. The coil is electrically connected to the battery for wirelessly charging an external device, the heat dissipation shell is installed on the shell and connected to the coil for conducting heat generated by the coil to the outside. The metal heat dissipation shell is installed on the wireless charging power bank in the present disclosure. When the wireless charging power bank is used by a user, the heat generated by the coil and the battery in the wireless charging power bank can be conducted out in time to prevent the problems of power decrease, user scalding, spontaneous combustion and the like caused by excessively high temperature of the wireless charging power bank.

18 Claims, 12 Drawing Sheets

10

11

11a

4a

11b

11c

11d

F

WIRELESS CHARGING POWER BANK

CROSS-REFERENCE TO RELATED APPLICATION

This application is a Continuation-in-Part of the U.S. application Ser. No. 19/006,894 filed on Dec. 31, 2024, and entitled "WIRELESS CHARGING POWER BANK" now pending, which claims priorities to Chinese Patent Application CN202423187014.7, filed on Dec. 23, 2024, the entire disclosures of which are incorporated herein by reference.

TECHNICAL FIELD

The present disclosure relates to the field of power banks, in particular to a wireless charging power bank.

BACKGROUND

The power bank is an essential thing for people in modern life. The power bank can charge mobile phones, tablets, headphones and other devices. However, when the devices are charged by the power bank, people have to face the trouble of messy data cables caused by different interfaces, and this problem is solved by the power bank with a wireless charging function. However, the wireless charging power bank will generate a lot of heat when charging devices. If the heat is not dissipated in time, the charging power of the power bank will be reduced, the user will be scalded, and even the risk of fire will be caused. Therefore, the present disclosure provides a wireless charging power bank, which can effectively solve the above problems.

SUMMARY

In order to solve the technical problem, the technical scheme provided by the present invention is as follows.

A wireless charging power bank includes a shell, a heat, a battery and a coil. The battery is installed on the shell; the coil is electrically connected to the battery for wirelessly charging an external device, the heat dissipation shell is installed on the shell and connected to the coil for conducting heat generated by the coil to the outside.

Furthermore, the heat dissipation shell is installed on the shell through a first connection assembly.

Furthermore, the first connection assembly includes a first connector arranged on the heat dissipation shell and a first fixture block arranged on the shell, the first connector includes a first connecting hole, the shell further includes a first slot, and the first fixture block is arranged in the first slot; the first connector is inserted in the first slot, the first fixture block is clamped in the first connecting hole so that the heat dissipation shell is installed on the shell, the first fixture block gets away from the first connecting hole so that the heat dissipation shell is detached from the shell.

Furthermore, the heat dissipation shell includes an annular boss, the shell includes a first installation groove, and when the heat dissipation shell is installed on the shell, the annular boss is clamped in the first installation groove.

Furthermore, the heat dissipation shell includes a circular first boss for bearing the coil, the first boss includes a first shaft hole, the coil includes a second shaft hole, the coil is configured and connected to the first boss, and the first shaft hole corresponds to the second shaft hole in position; and the shell further includes a second convex shaft, and the first shaft hole of the heat dissipation shell and the second shaft hole of the coil are sleeved on the second convex shaft.

Furthermore, the wireless charging power bank further includes a magnet, and the magnet is used for adsorbing an external device; the magnet is connected with the shell through a second connection assembly; the heat dissipation shell further includes a second installation groove, and the magnet is configured inside the second installation groove; and the shell includes a first installation groove.

Furthermore, the second connection assembly includes a convex block arranged on the magnet and a neck arranged on the shell, the magnet includes an extension end, the convex block is arranged on the extension end, the shell includes a first through hole, and the first through hole is formed in the first installation groove; the heat dissipation shell further includes a second through hole, the second through hole is formed in the second installation groove and corresponds to the first through hole; and after the extension end passes through the second through hole and the first through hole, the convex block is clamped into the neck so that the magnet is installed in the second installation groove.

Furthermore, the wireless charging power bank further includes a cover plate, and the cover plate is connected with the shell through a third connection assembly; the heat dissipation shell further includes a second installation groove; and the shell includes a first installation groove.

Furthermore, the third connection assembly includes a first convex shaft arranged on the cover plate and a hollow second convex shaft arranged on the shell, one side of the first convex shaft is provided with a protruding second fixture block, the first convex shaft is inserted into the hollow second convex shaft, the second fixture block is clamped into an inside wall of the shell, so that the cover plate is installed on the shell; and a surface of the cover plate is provided with a plurality of strip bulges.

Furthermore, an inside edge of the cover plate is provided with a plurality of second connectors, and one side of the second connector is provided with a third fixture block; a second connecting hole is formed in the second installation groove, a third connecting hole corresponding to the second connecting hole in position is formed in the first installation groove, the second connector is inserted in the second connecting hole and the third connecting hole, and the third fixture block is clamped into the inside wall of the first shell.

Furthermore, the shell includes a first shell and a second shell that are detachably connected, the shell further includes a fourth connection assembly, and the first shell is connected with the second shell through the fourth connection assembly.

Furthermore, the fourth connection assembly includes a third connector arranged on the second shell and a fourth connecting hole formed in the first shell, one end of the third connector includes a fourth fixture block, the first shell includes a second slot, and the fourth connecting hole is formed in the second slot; the third connector is inserted in the second slot, and the fourth fixture block is clamped in the fourth connecting hole so that the first shell is connected with the second shell; and the fourth fixture block gets away from the fourth connecting hole so that the second shell is detached from the first shell.

Furthermore, the shell includes a first installation groove; the heat dissipation shell includes a second installation groove; and the wireless charging power bank further includes a control circuit board, and the control circuit board is arranged in the shell and electrically connected with the battery.

Furthermore, the first installation groove includes a first conductor hole, the second installation groove includes a second conductor hole, the first conductor hole corresponds to the second conductor hole in position, and the coil passes through the first conductor hole and the second conductor hole to be electrically connected with the control circuit board.

Furthermore, the control circuit board includes an indicator light; and a notch is formed in the position, corresponding to the indicator light, of the shell.

Furthermore, the control circuit board further includes a power interface.

Furthermore, the shell is provided with a power button, and the power button is electrically connected with the control circuit board.

Furthermore, a plurality of heat sinks are formed in a surface of the heat dissipation shell.

Furthermore, the wireless charging power bank further includes heat insulation boards, and the heat insulation boards are arranged on both sides of the battery; and the heat insulation board is made of aerogel.

Furthermore, the heat dissipation shell is connected to the shell through a connection assembly; the fifth connection assembly includes a locating slot formed in the heat dissipation shell and an elastic member arranged on the shell, one end of the elastic member is tilted outward, and one end of the elastic member is clamped into the locating slot so that the heat dissipation shell is installed on the shell.

The present invention has the following beneficial effects. The metal heat dissipation shell is installed on the wireless charging power bank in the present disclosure. When the wireless charging power bank is used by a user, the heat generated by the coil and the battery in the wireless charging power bank can be conducted out in time to prevent the problems of power decrease, user scalding, spontaneous combustion and the like caused by excessively high temperature of the wireless charging power bank. The heat dissipation shell provides a good heat dissipation performance for the wireless charging power bank, so that a better use experience is provided for the user, and the safety of the wireless charging power bank is improved.

BRIEF DESCRIPTION OF THE DRAWINGS

In order to explain the technical solutions of the embodiments of the present invention more clearly, the following will briefly introduce the accompanying drawings used in the embodiments. Apparently, the drawings in the following description are only some embodiments of the present invention. Those of ordinary skill in the art can obtain other drawings based on these drawings without creative work.

The present invention is further described below in detail in combination with the accompanying drawings and embodiments.

DETAILED DESCRIPTION OF THE EMBODIMENTS

Figure 1:
FIG. 1 is a breakdown schematic diagram in the present disclosure, and a stereochemical structural schematic diagram in an embodiment.
Figure 2:
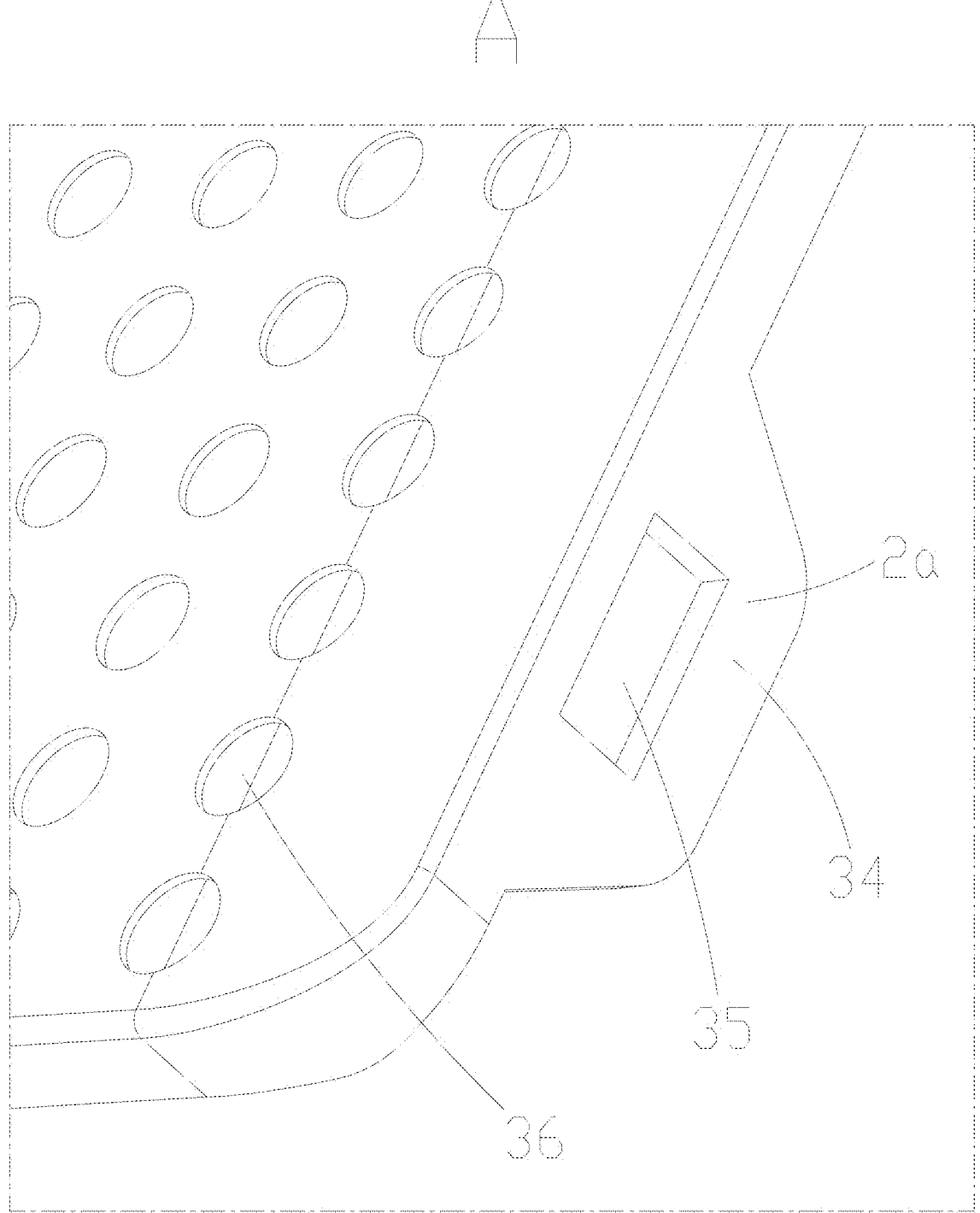
FIG. 2 is an enlarged drawing of part A in FIG. 1.
Figure 3:
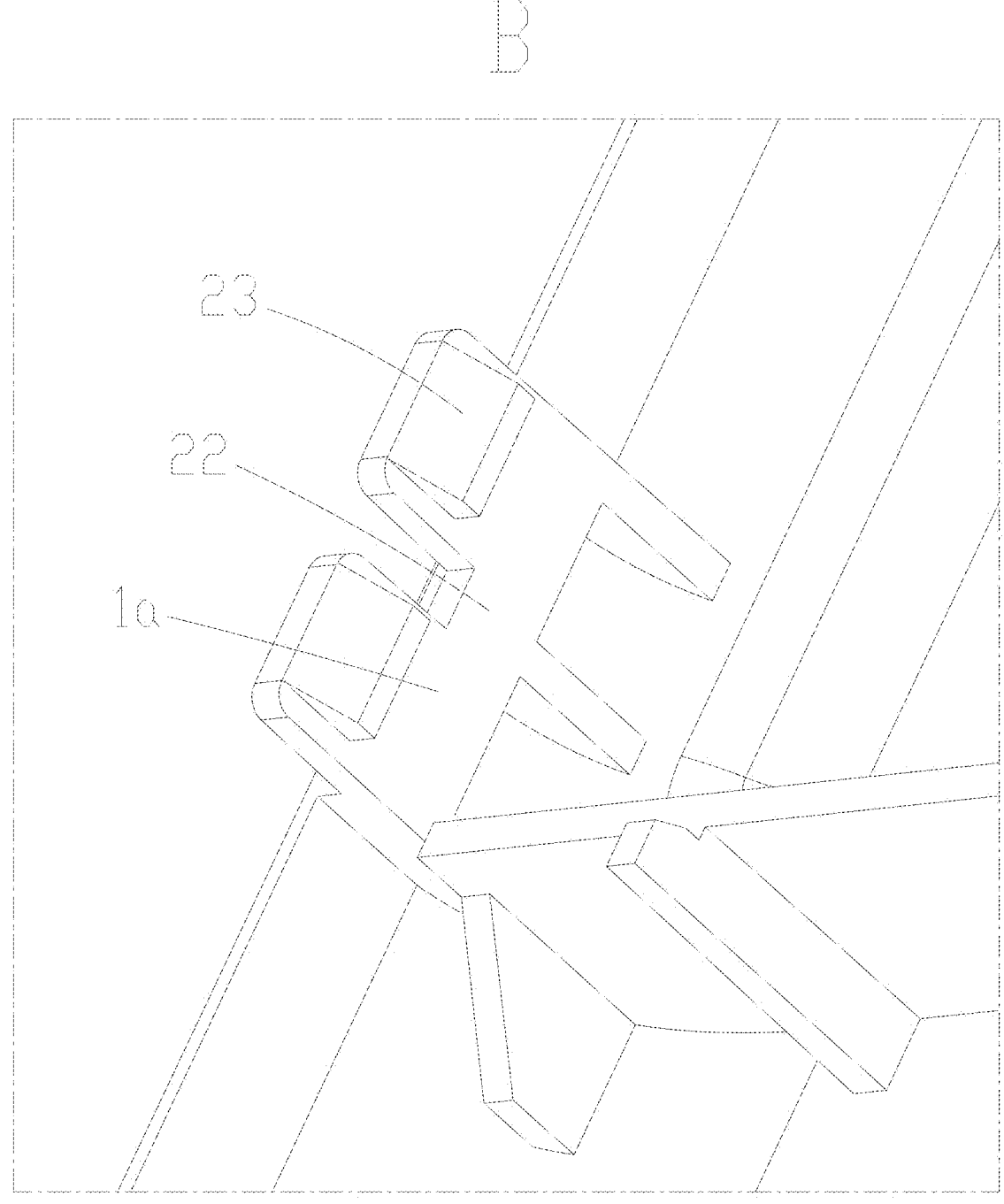
FIG. 3 is an enlarged drawing of part B in FIG. 1.
Figure 4:
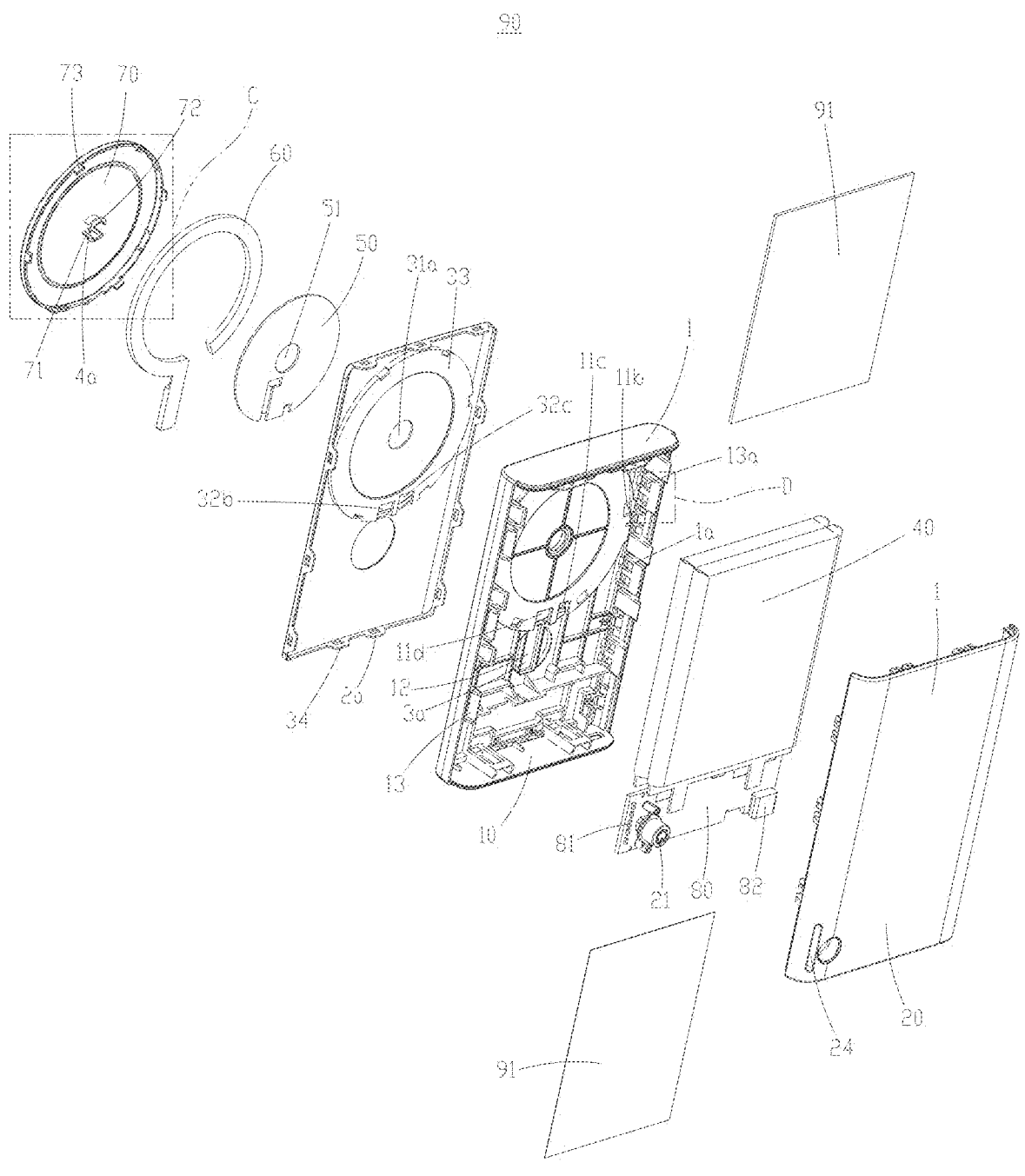
FIG. 4 is a breakdown schematic diagram at another angle in the present disclosure.
Figure 5:
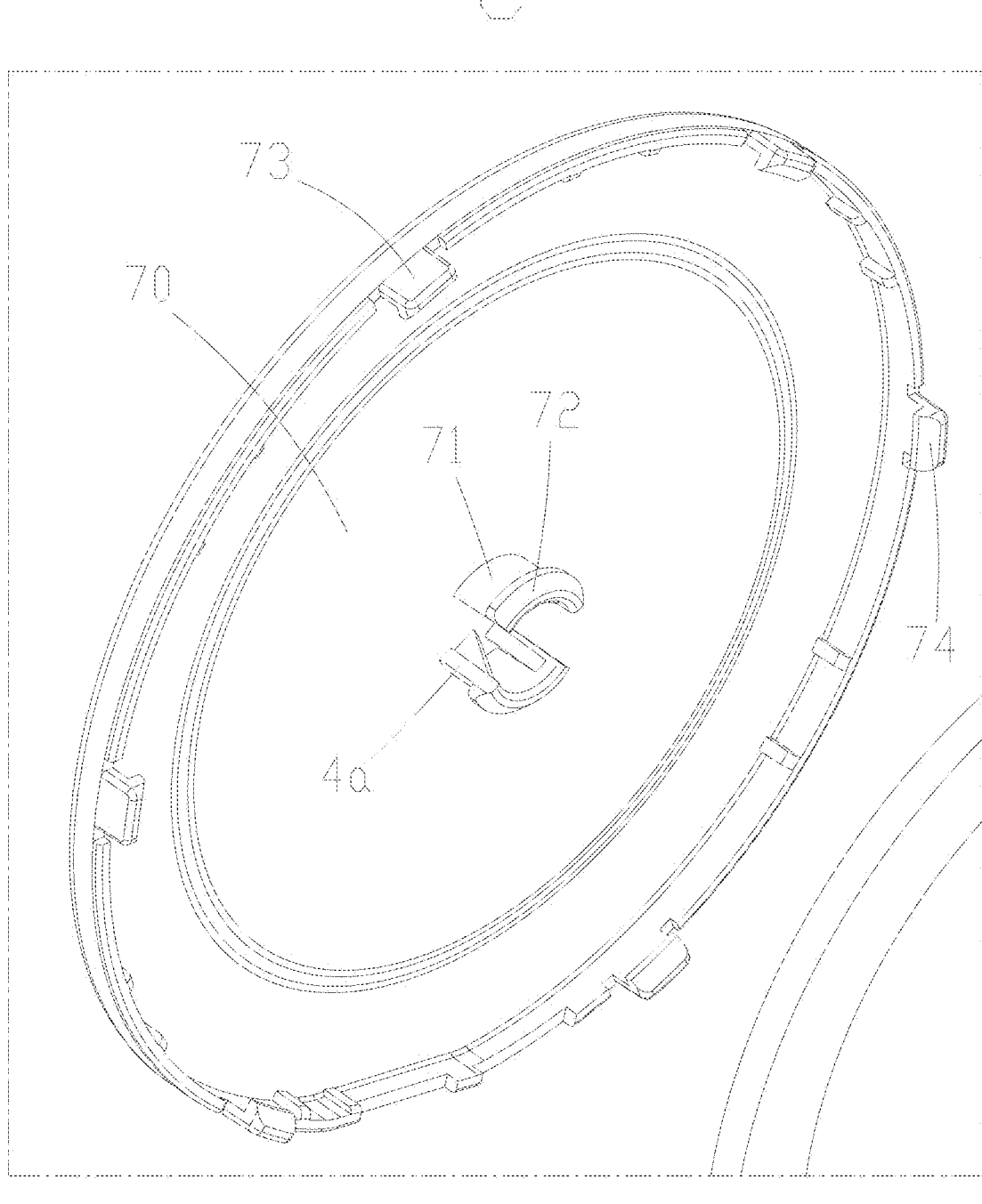
FIG. 5 is an enlarged drawing of part C in FIG. 4.
Figure 6:
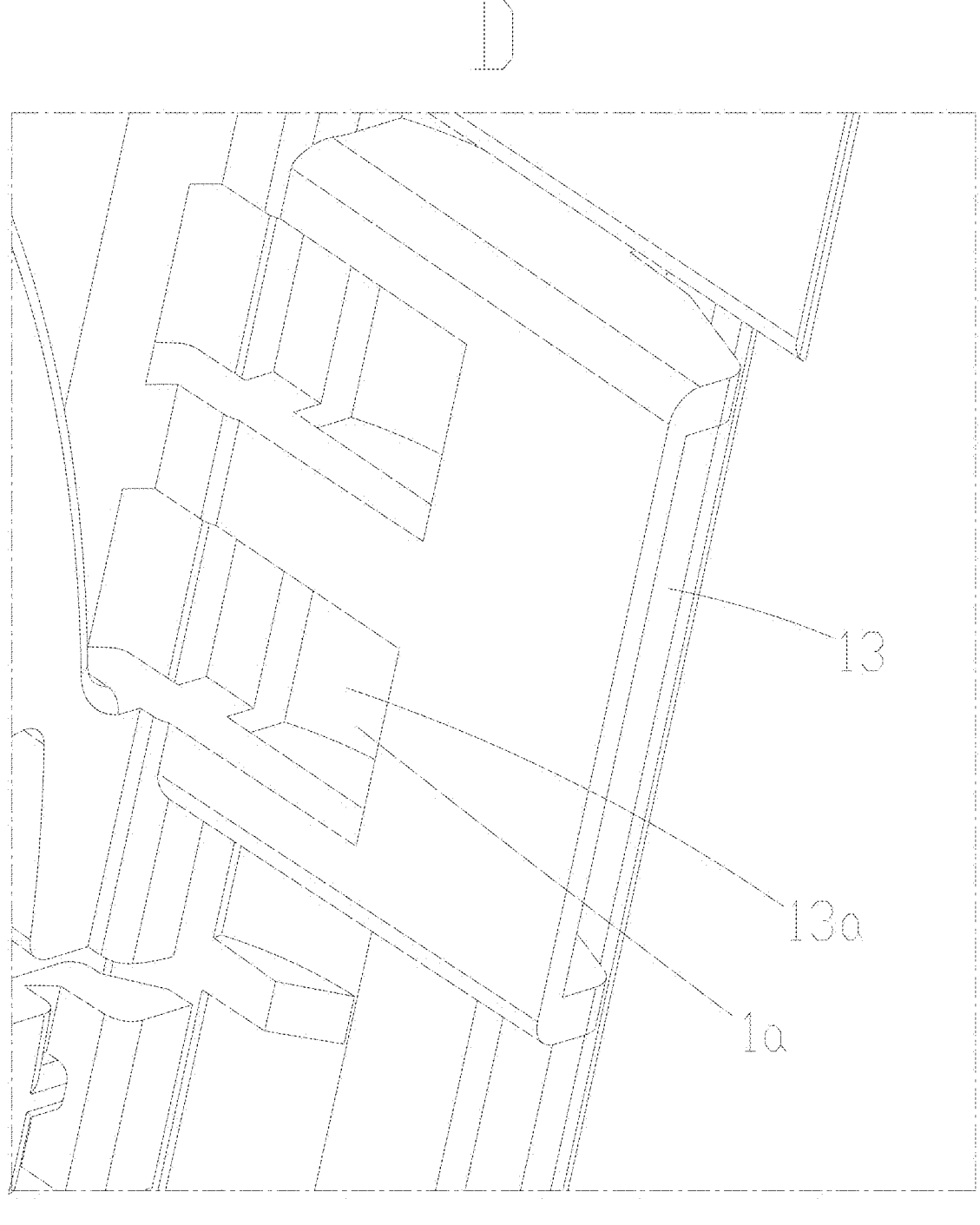
FIG. 6 is an enlarged drawing of part D in FIG. 4.
Figure 7:
FIG. 7 is a stereochemical structural schematic diagram of a first shell in the present disclosure.
Figure 8:
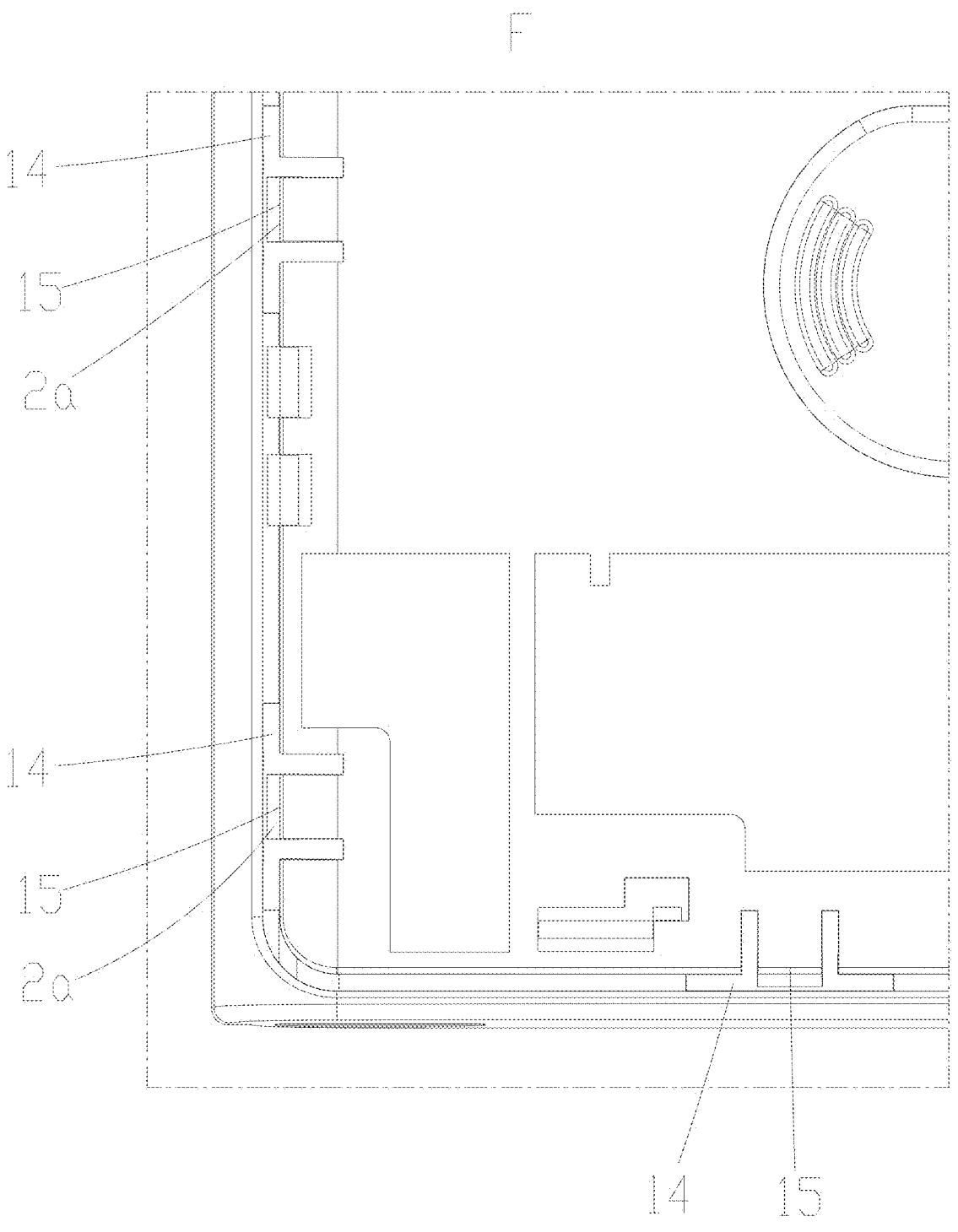
FIG. 8 is an enlarged drawing of part F in FIG. 7.
Figure 9:
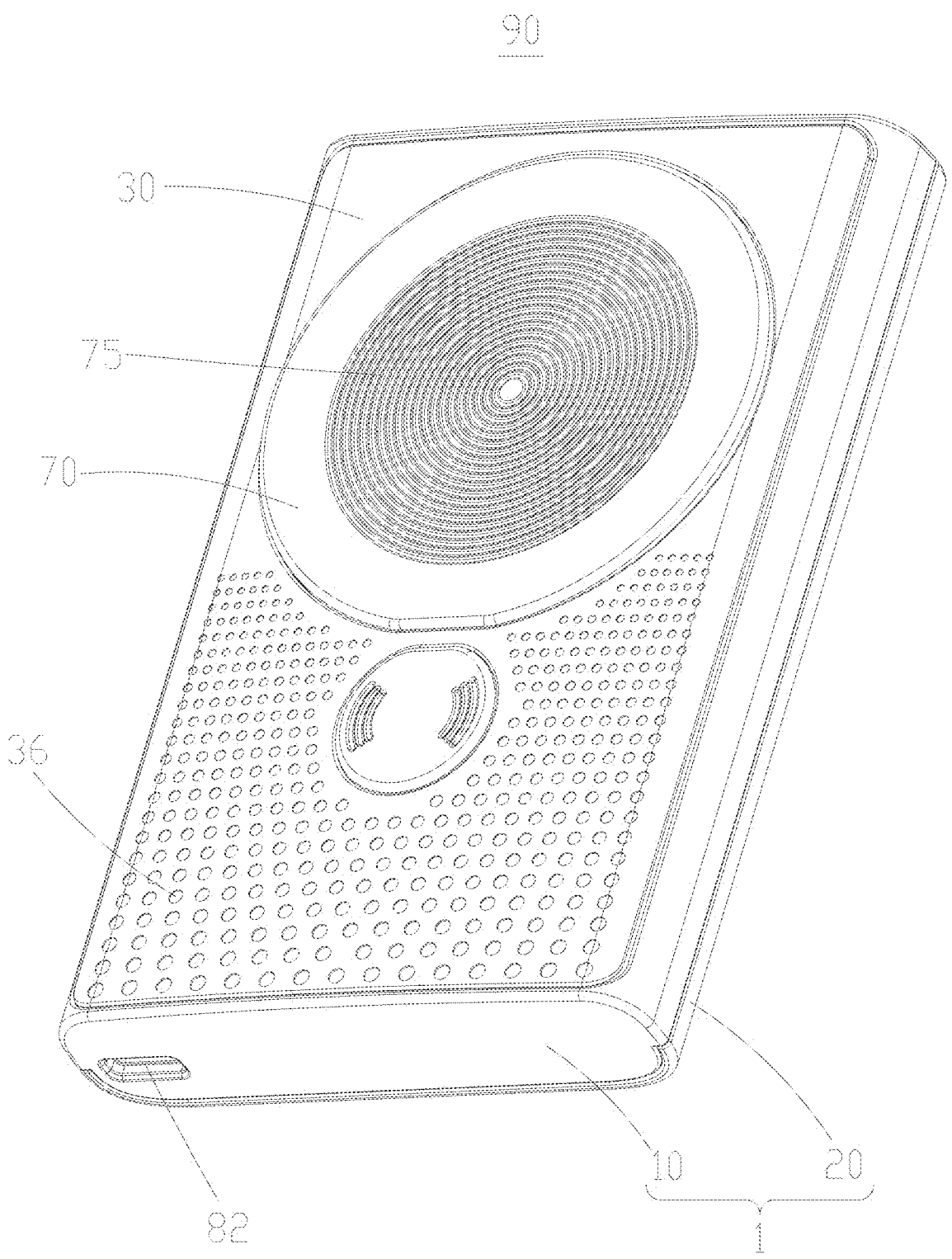
FIG. 9 is a stereoscopic structural schematic diagram of the present disclosure.
Figure 10:
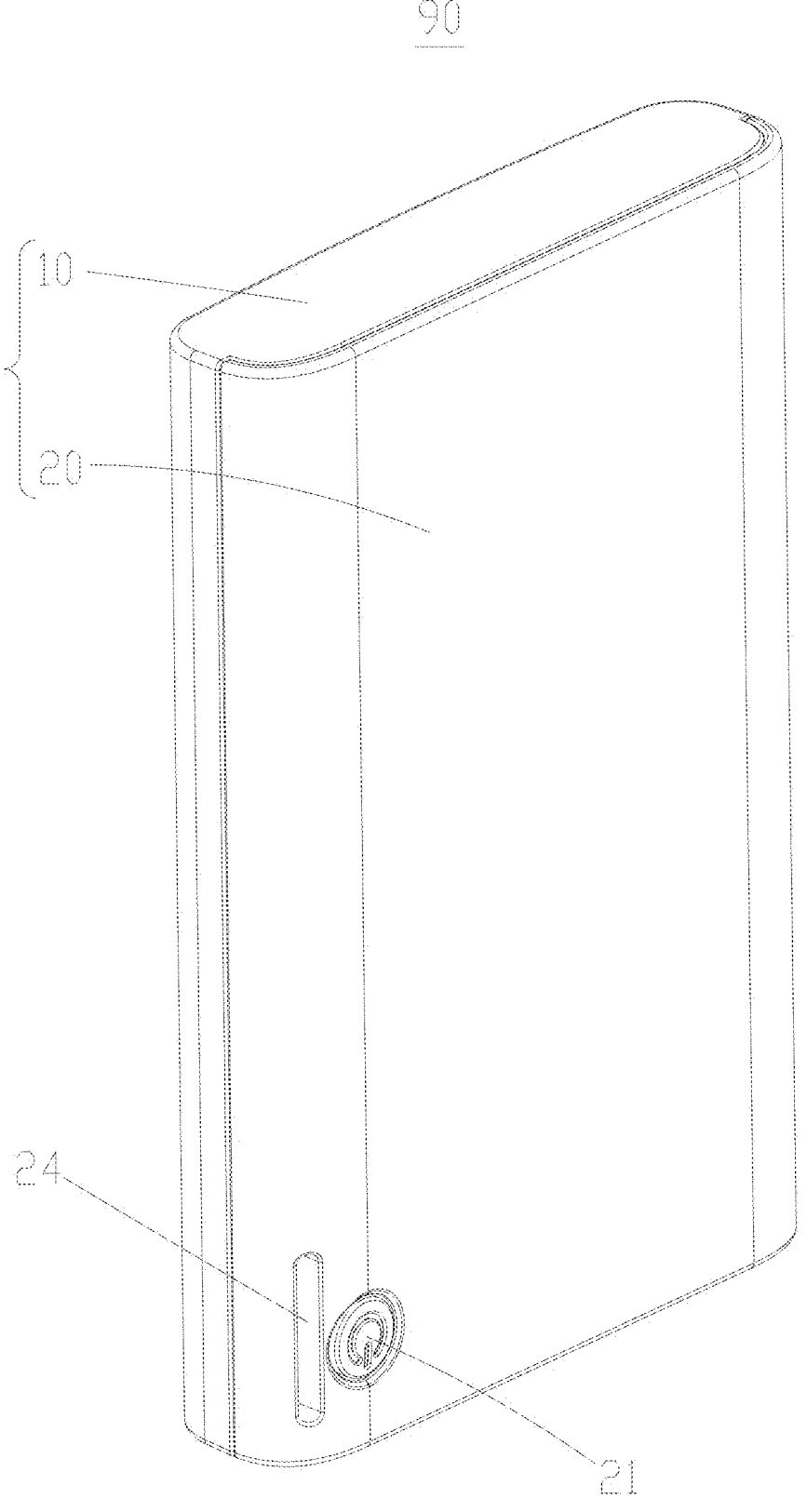
FIG. 10 is a stereoscopic structural schematic diagram at another angle in the present disclosure.
Figure 11:
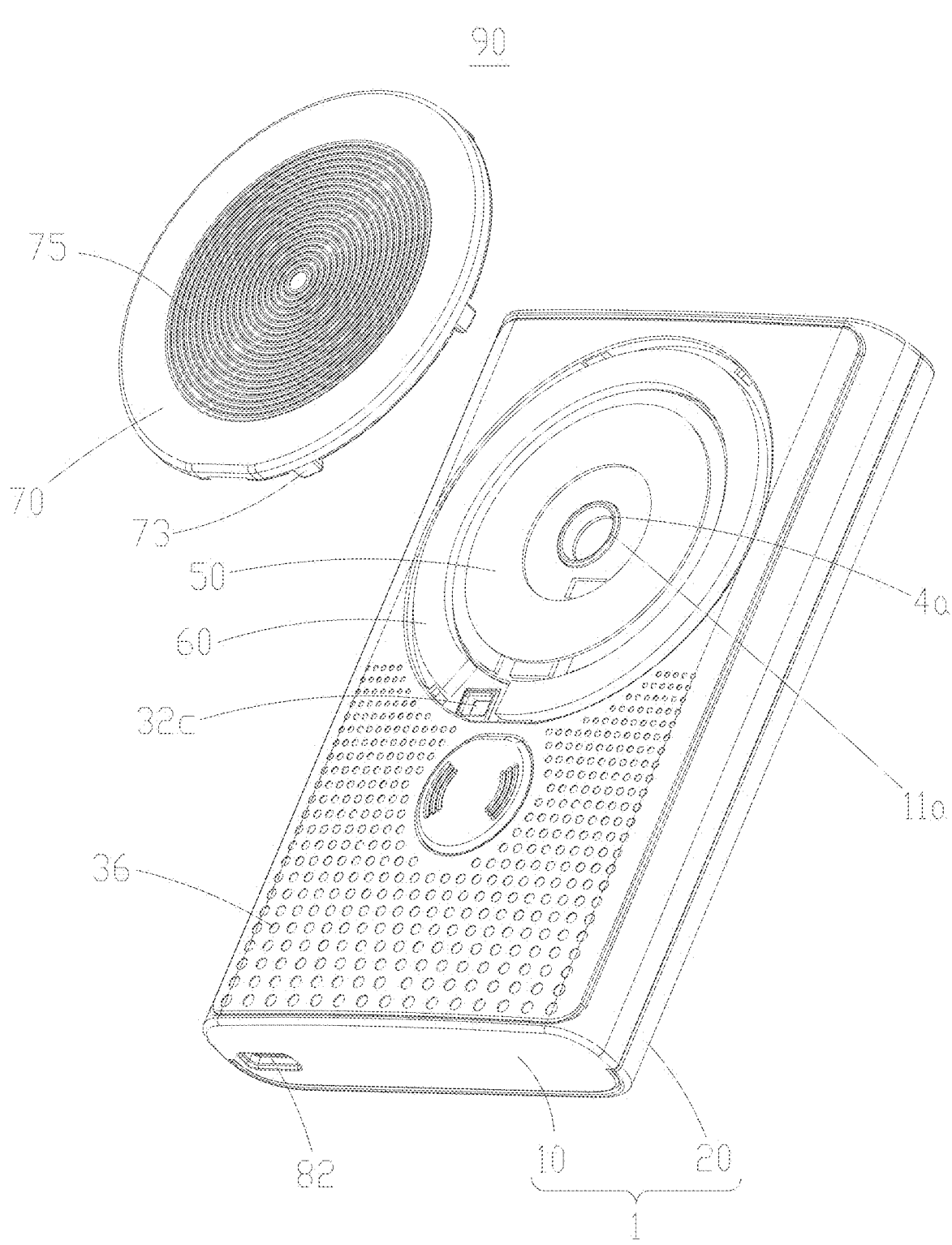
FIG. 11 is a breakdown schematic diagram at another angle in the present disclosure.

The technical solutions in the embodiments of the present invention will be clearly and completely described below in conjunction with the accompanying drawings in the embodiments of the present invention. Apparently, the described embodiments are only a part of the embodiments of the present invention, rather than all the embodiments. Based on the embodiments in the present invention, all other embodiments obtained by those ordinarily skilled in the art without doing creative work shall fall within the protection scope of the present invention.

Referring to FIG. 1 to FIG. 11, the present disclosure provides a wireless charging power bank 90, including a shell 1, a heat dissipation shell 30, a battery 40 and a coil 50. The battery 40 is installed on the shell 1. The coil 50 is electrically connected to the battery 40 for wirelessly charging an external device. The heat dissipation shell 30 is installed on the shell 1 and connected to the coil 50 for conducting heat generated by the coil 50 and the battery 40 to the outside.

The metal heat dissipation shell 30 is installed on the wireless charging power bank 90 in the present disclosure. When the wireless charging power bank 90 is used by a user, the heat generated by the coil 50 and the battery 40 in the wireless charging power bank 90 can be conducted out in time to prevent the problems of power decrease, user scalding, spontaneous combustion and the like caused by excessively high temperature of the wireless charging power bank 90. The heat dissipation shell 30 provides a good heat dissipation performance for the wireless charging power bank 90, so that a better use experience is provided for the user, and the safety of the wireless charging power bank 90 is improved.

It can be understood that the battery 40 is installed on the shell 1 of the wireless charging power bank 90. The heat dissipation shell 30 is installed on the shell 1, and a part of the heat dissipation shell 30 is connected with the coil 50. When the wireless charging power bank 90 is in operation, the heat generated by the coil 50 and the battery 40 will be conducted to the heat dissipation shell 30, and then the heat dissipation shell 30 conducts the heat to the external environment. The heat dissipation shell 30 may be made of heat dissipation materials such as aluminum, iron and silver to increase heat conduction, thereby increasing heat dissipation efficiency of the heat dissipation shell 30.

Further, the heat dissipation shell 30 is installed on the shell 1 through a first connection assembly 2a.

It can be understood that the heat dissipation shell 30 is detachably connected with the shell 1 through a first connection assembly 2a without traditional fasteners such as bolts and rivets, thereby facilitating quick assembly and quick disassembly in a production link, simplifying production and assembly links, and improving the efficiency.

Further, the fourth connection assembly 2a includes a first connector 34 arranged on the heat dissipation shell 30 and a first fixture block 15 arranged on the shell 1. The first connector 34 includes a first connecting hole 35. The shell 1 further includes a first slot 14. The first fixture block 15 is arranged in the first slot 14. The first connector 34 is inserted in the first slot 14. The first fixture block 15 is clamped in the first connecting hole 35 so that the heat dissipation shell 30 is installed on the shell 1. The first fixture block 15 gets away from the first connecting hole 35 so that the heat dissipation shell 30 is detached from the shell 1.

It can be understood that four first connectors 34 are provided, and four first slots 14 are provided, and the positions of the four first connectors 34 correspond to those of the four first slots 14 one to one. After the first connector 34 is inserted into the first slot 14, the first fixture block 15 in the first slot 14 is clamped into the first connecting hole 35 in the first connector 34, so that the heat dissipation shell 30 is locked on the first shell 1. The first fixture block 15 is removed from the first connecting hole 35, and the first connector 34 is pulled out from the first slot 14, so that the heat dissipation shell 30 is detached from the shell 1.

The metal heat dissipation shell 30 and the first connector 34 are integrally formed by a mold, and a metal needs to be bent in the traditional process. After the metal is bent, the yield strength of the metal may decrease, and cracks may be generated at a bent portion, so that the metal is prone to be bent or fractured. However, in this embodiment, because an abrasive tool is used for integral molding, the metal strength at the first connector 34 is uniform, and the first connector 34 is more durable.

Further, the inner side of the heat dissipation shell 30, at the position corresponding to a second installation groove 32, is provided with an annular boss 33. A first installation groove 11 matched with the size of the annular boss 33 is formed in the outer side of the first shell 1, and when the heat dissipation shell 30 is installed on the first shell 1, the annular boss 33 is clamped into the first installation groove 11.

It can be understood that the shape and size of the annular boss 33 are matched with the size of the first installation groove 11, and when the heat dissipation shell 30 is installed on the first shell 1, the annular boss 33 can be clamped into the first installation groove 11, so that the stability of the heat dissipation shell 30 when being fixed with the shell 1 is strengthened.

Further, the outer side of the heat dissipation shell 30 is provided with a circular first boss 31 for bearing the coil 50. A first shaft hole 31*a* is formed in the middle of the first boss 31. A second shaft hole 51 is formed in the middle of the coil 50. The coil 50 is configured on the first boss 31. The first shaft hole 31*a* corresponds to the second shaft hole 51 in position. A hollow second convex shaft 11*a* is arranged at a circle center position of the first installation groove 11. The first shaft hole 31*a* of the heat dissipation shell 30 and the second shaft hole 51 of the coil 50 are sleeved on the second convex shaft 11*a*.

It can be understood that the coil 50 is arranged on the first boss 31, so that the coil 50 is connected with the heat dissipation shell 30, and the heat generated when the coil 50 is in operation is conducted to the heat dissipation shell 30. The second shaft hole 51 is formed in the center of the coil 50 and the first shaft hole 31*a* is formed in the center of the first boss 31, so that the coil 50 and the heat dissipation shell 30 are facilitated to be fixed on the shaft body. The installation is convenient, and the design is simple and practical. The second shaft hole 51 of the coil 50 is sleeved on the second convex shaft 11*a*, and the first shaft hole 31*a* of the heat dissipation shell 30 is sleeved on the second convex shaft 11*a*, so that the coil 50 and the heat dissipation shell 30 can be fixed, and the design is simple and practical.

Further, the wireless charging power bank 90 further includes an annular magnet 60, and the annular magnet 60 is used for adsorbing the external device. The magnet 60 is connected with the shell 1 through a second connection assembly 3*a*. A second installation groove 32 is formed in the heat dissipation shell 30 around the first boss 31, and the magnet 60 is configured inside the second installation groove 32.

It can be understood that the wireless charging power bank 90 is provided with a magnet 60, and the magnet 60 is connected with the shell 1 through the second connection assembly 3*a*, thereby facilitating quick assembly during production, simplifying production and assembly links, and improving the efficiency. The magnet 60 can make the wireless charging power bank 90 have a magnetic attraction function, and can attract an external charging device, thus providing a richer use experience for the user. Specifically, the magnet 60 used in this embodiment has a large magnetic force, and at least when the wireless charging power bank 90 uses a battery 40 having a capacity of more than 10000 mAh, after the wireless charging power bank 90 is adsorbed on the external charging device, when the user takes the external charging device, the wireless charging power bank 90 can still be adsorbed on the charging device without falling.

Further, the second connection assembly 3*a* includes a convex block 61 arranged on the magnet 60 and a neck 12 arranged on the shell 1. The magnet 60 includes an extension end, and the convex block 61 is arranged on the extension end. A first through hole 11*d* is formed in the first installation groove 11. A second through hole 32*b* is formed in the second installation groove 32 and at a corresponding position of the first through hole 11*d*. The neck 12 matched with the convex block 61 is formed in the inner side of the first shell 1. After the extension end passes through the second through hole 32*b* and the first through hole 11*d*, the convex block 61 is clamped into the neck 12 so that the magnet 60 is installed in the second installation groove 32.

It can be understood that after the extension end of the magnet 60 passes through the first through hole 11*d* and the second through hole 32*b*, the convex block 61 on the extension end can be clamped into the neck 12 inside the shell 1, so that the magnet 60 is fixed in the second installation groove 32, design is simple and practical, and quick assembly and quick disassembly are facilitated, bolts are avoided from being used, and the assembly efficiency is improved.

Further, the wireless charging power bank 90 further includes a cover plate 70 matched with the size of the second installation groove 32, and the cover plate 70 is connected with the shell 1 through a third connection assembly 4*a*.

It can be understood that the cover plate 70 is closed on the shell 1, which can protect the coil 50 and the magnet 60, and can improve the overall attractive appearance. The cover plate 70 is connected with the shell 1 through the third connection assembly 4*a*, thereby facilitating quick assembly during production, simplifying production assembly process, and improving the efficiency.

Further, the middle of the inner side of the cover plate 70 is provided with a first convex shaft 71. One side of the first convex shaft 71 is provided with a protruding second fixture block 72. The first convex shaft 71 passes through the first shaft hole 31*a* and the second shaft hole 51 and is inserted into the hollow second convex shaft 11*a*. The second fixture block 72 is clamped into an inside wall of the shell 1, so that the coil 50 is covered with the cover plate 70 and the cover plate 70 is installed inside the second installation groove 32.

It can be understood that the first convex shaft 71 in the center of the cover plate 70 can be inserted into the hollow second convex shaft 11*a*, and the second fixture block 72 arranged on the first convex shaft 71 can be clamped into the inside wall of the shell 1 to connect the cover plate 70 to the shell 1. The first convex shaft 71 is of elasticity, which is convenient for the user to install and detach the cover plate 70.

Further, an inside edge of the cover plate 70 is provided with a plurality of second connectors 73, and one side of the second connector 73 is provided with a third fixture block 74. A second connecting hole 32a is formed in the second installation groove 32. A third connecting hole 11b corresponding to the second connecting hole 32a in position is formed in the first installation groove 11. The second connector 73 is inserted in the second connecting hole 32a and the third connecting hole 11b. The third fixture block 74 is clamped into the inside wall of the shell 1.

It can be understood that the position of the second connector 73 corresponds to that of the second connecting hole 32a one to one. After the first connector is 73 inserted into the second connecting hole 32a, the third fixture block 74 on the second connector 73 can be clamped into the inside wall of the shell 1 to further fix the cover plate 70. The second connector 73 is of elasticity, which is convenient for rapid disassembly and installation of the cover plate 70.

Further, the wireless charging power bank 90 also includes a control circuit board 80, and the control circuit board 80 is arranged inside the shell 1 and electrically connected with the battery 40.

It can be understood that the control circuit board 80 can control the power-on and power-off of the wireless charging power bank 90, and current can also be converted into alternating current and conducted to the coil 50, so that the coil 50 generates a magnetic field.

Further, a first conductor hole 11c is formed in the first installation groove 11. A second conductor hole 32c is formed in the second installation groove 32 and at a corresponding position of the first conductor hole 11c. The coil 50 is electrically connected with the control circuit board 80 through the first conductor hole 11c and the second conductor hole 32c.

It can be understood that one end of the coil 50 is connected with the control circuit board 80 after passing through the first conductor hole 11c and the second conductor hole 32c, so that the space is reasonably utilized, and the design is simple and practical.

Further, the control circuit board 80 is provided with an indicator light 81. A notch 24 is formed in the position, corresponding to the indicator light 81, of the shell 1.

It can be understood that a plurality of indicator lights 81 are arranged in sequence. The indicator light 81 can show electricity The more the remaining battery power is, the larger the number of the on indicator lights 81 is. The less the remaining battery power is, the smaller the number of the on indicator lights 81 is.

In some embodiments, the number of the indicator lights 81 may be one, and the color of the indicator light 81 may change depending on the amount of battery power. When the amount of power is large, the color of the indicator light 81 trends green. When the amount of power is small, the color of the indicator light 81 trends red.

The user can see the indicator light 81 through the slot to know how much battery power remains, so that the user experience is improved.

Further, the control circuit board 80 is further provided with a power interface 82.

It can be understood that the user can connect a power cord to the power interface 82 to charge the wireless charging power bank 90, and the power interface 82 can be, but is not limited to, a commonly used interface such as USB and Type-C.

Further, the shell 1 is provided with a power button 21, and the power button 21 is electrically connected with the control circuit board 80.

It can be understood that the user can control the wireless charging power bank 90 to start charging or stop charging by pressing the power button 21, which is convenient for the user to use.

Further, the shell 1 includes a first shell 10 and a second shell 20 that are detachably connected. The shell 1 further includes a fourth connection assembly 1a. The first shell 10 and the second shell 20 are connected through the fourth connection assembly 1a.

It can be understood that the shell 1 is formed by connecting the first shell 10 and the second shell 20. The first shell 10 and the second shell 20 form an accommodation space. The first shell 10 is connected with the second shell 20 through the fourth connecting assembly 1a without traditional fasteners such as bolts and rivets, so that quick assembly and quick disassembly are facilitated, the production and assembly links are simplified, and the efficiency is improved.

Further, the fourth connection assembly 1a includes a third connector 22 arranged on the inner side of the second shell 20 and a fourth connecting hole 13a formed in the first shell 10. One end of the third connector 22 includes a fourth fixture block 23. The first shell 10 includes a first slot 13. The fourth connecting hole 13a is formed in the first slot 13. The third connector 22 is inserted in the first slot 13, and the fourth fixture block 23 is clamped into the fourth connecting hole 13a so that the first shell 10 is connected with the second shell 20. The fourth fixture block 23 gets away from the fourth connecting hole 13a so that the second shell 22 is detached from the first shell 13.

It can be understood that four third connectors 22 are provided, and four second slots 13 are provided. The positions of the four third connectors 22 correspond to those of the four second slots 13 one to one. After the third connector 22 is inserted into the first slot 13, the fourth fixture block 23 arranged on the third connector 22 is clamped into the fourth connecting hole 13a in the first slot 13, so that the first shell 10 is locked on the second shell 20. The third connector 22 is of elasticity, and after the fourth fixture block 23 is moved out of the fourth connecting hole 13a, the third connector 22 is pulled out from the second slot 13 to detach the first shell 10 from the second shell 20.

Further, a plurality of heat sinks 36 are formed in a surface of the heat dissipation shell 30.

It can be understood that the heat sinks 36 can increase the heat dissipation area of the heat dissipation shell 30, so that the heat dissipation performance of the heat dissipation shell 30 is further improved. At the same time, when the external device is charged on the wireless charging power bank 90, the heat sinks 36 can reduce the contact area between the heat dissipation shell 30 and the external device, so that the heat accumulation is little, and the heat dissipation performance is improved.

Further, the wireless charging power bank 90 also includes heat insulation boards 91, and the heat insulation boards are arranged on both sides of the battery 40. The heat insulation board 91 may be made of aerogel.

It can be understood that the number of heat insulation boards 91 is two. When the wireless charging power bank 90 is in operation, the battery 40 will generate heat. The heat insulation boards 91 are attached to both sides of the battery 40 and a main surface of the battery 40 is covered with the heat insulation boards 91, which can effectively block the heat generated by the battery 40 from being conducted to the external shell 1 to provide a better experience for the user. At the same time, the heat insulation board 91 can also play a buffering role, so that the battery 40 can be provided.

Further, the surface of the cover plate 70 is provided with a plurality of strip bulges 75.

It can be understood that the plurality of strip bulges 75 on the surface of the cover plate 70 can increase the surface area of the surface of the cover plate 70, so that the heat dissipation area is increased, and the heat dissipation performance is further enhanced.

Figure 12:
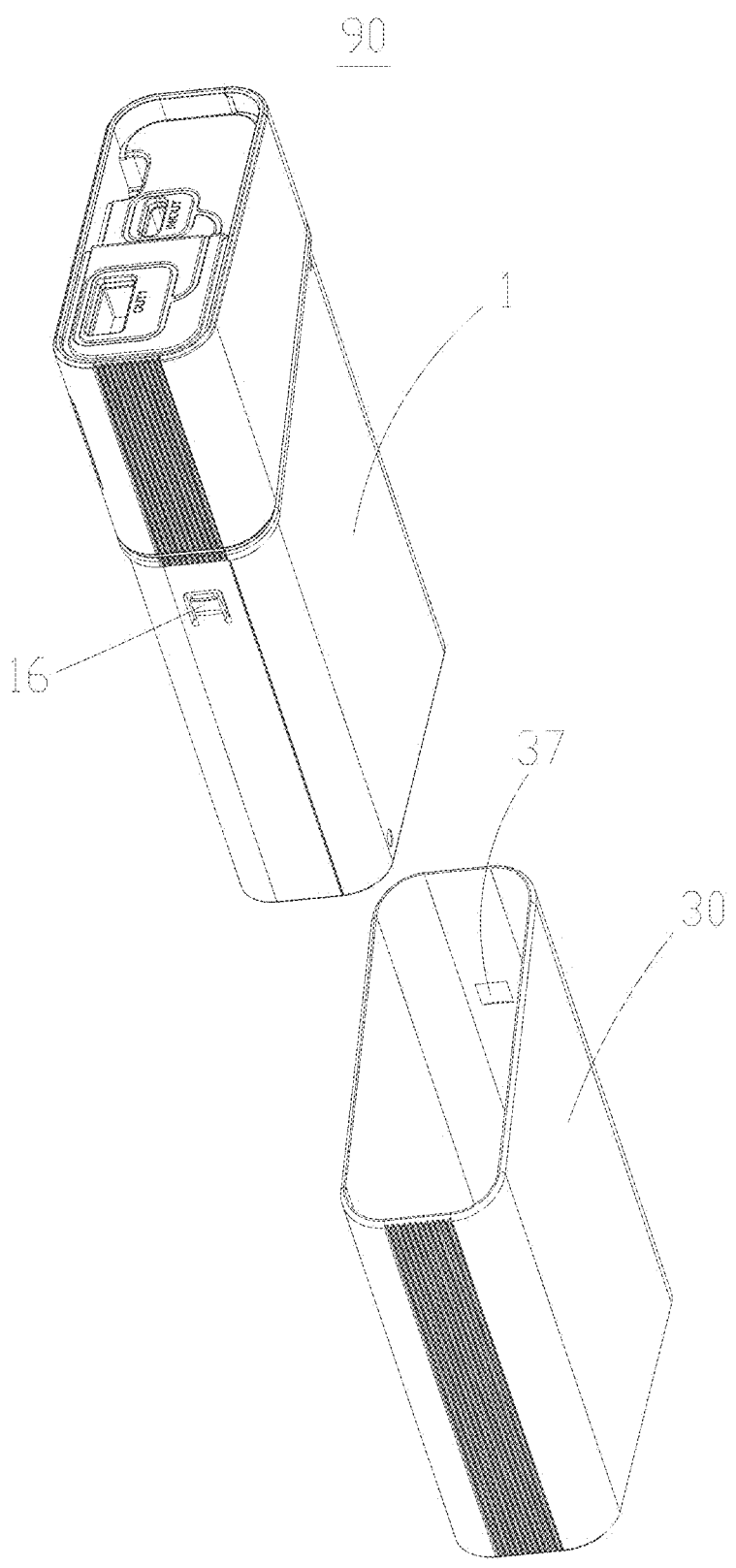
FIG. 12 is an exploded view in another embodiment of the present disclosure.

Further, as shown in FIG. 12, in another embodiment, internal structures are the same, and thus decomposed display is not shown. The difference is that the heat dissipation housing 30 is installed on the shell 1 through a connection assembly. The connection assembly includes a locating slot 37 arranged on the heat dissipation shell 30 and an elastic member 16 arranged on the shell 1. One end of the elastic member 16 is tilted outward, and one end of the elastic member 16 is clamped into the locating slot 37 so that the heat dissipation shell 30 is installed on the shell 1.

It can be understood that the number of the elastic members 16 is 2, and the elastic members 16 are arranged on both sides of the shell 1. The number of the locating slots 37 is 2, and the locating slots 37 are formed in both sides of an inner wall of the heat dissipation shell 30. The shell 1 includes the elastic members 16. The elastic member 16 is of elasticity. One end of the elastic member 16 is tilted outward. The locating slot 37 is formed in the inner wall of the heat dissipation shell 30. When the heat dissipation shell 30 is sleeved on the shell 1, the shell 1 compresses the elastic member 16 until the tilted end of the elastic member 16 slides into the locating slot 37, so that the heat dissipation shell 30 is fixed on the shell 1. By using an installation method of the fourth connection assembly 5a, the production process can be saved, the installation speed can be accelerated, and costs can be saved while the production efficiency is improved.

As described above, one or more embodiments are provided in conjunction with the detailed description, The specific implementation of the present invention is not confirmed to be limited to that the description is similar to or similar to the method, the structure and the like of the present invention, or a plurality of technical deductions or substitutions are made on the premise of the conception of the present invention to be regarded as the protection of the present invention.

What is claimed is:

1. A wireless charging power bank, comprising a shell, a heat dissipation shell, a battery and a coil, wherein the battery is installed on the shell; the coil is electrically connected to the battery for wirelessly charging an external device, the heat dissipation shell is installed on the shell and connected to the coil for conducting heat generated by the coil to the outside;

wherein the heat dissipation shell is made of metal, and is installed on the shell through a first connection assembly, and the first connection assembly comprises a first connector arranged on the heat dissipation shell and a first fixture block arranged on the shell, the first connector comprises a first connecting hole, the shell further comprises a first slot, the first fixture block is inserted in the first slot, and further clamped in the first connecting hole, so that the heat dissipation shell is installed on the shell; when the first fixture block gets away from the first connecting hole, the heat dissipation shell is detached from the shell; and wherein the heat dissipation shell comprises a charging portion for charging the external device, and a plurality of heat sinks located at a surface extending from the charging portion and exposed outside, the charging portion having the coil enclosed therein, and the heat dissipation shell serves as an outer shell of the wireless charging power bank for supporting the external device.

2. The wireless charging power bank according to claim 1, wherein the heat dissipation shell comprises an annular boss, the shell comprises a first installation groove, and when the heat dissipation shell is installed on the shell, the annular boss is clamped in the first installation groove.

3. The wireless charging power bank according to claim 1, wherein the heat dissipation shell comprises a circular first boss for bearing the coil, the first boss comprises a first shaft hole, the coil comprises a second shaft hole, the coil is configured and connected to the first boss, and the first shaft hole corresponds to the second shaft hole in position; and the shell further comprises a second convex shaft, and the first shaft hole of the heat dissipation shell and the second shaft hole of the coil are sleeved on the second convex shaft.

4. The wireless charging power bank according to claim 1, wherein the wireless charging power bank further comprises a magnet, and the magnet is used for adsorbing an external device; the magnet is connected with the shell through a second connection assembly; the heat dissipation shell further comprises a second installation groove, and the magnet is configured inside the second installation groove; and the shell comprises a first installation groove.

5. The wireless charging power bank according to claim 4, wherein the second connection assembly comprises a convex block arranged on the magnet and a neck arranged on the shell, the magnet comprises an extension end, the convex block is arranged on the extension end, the shell comprises a first through hole, and the first through hole is formed in the first installation groove; the heat dissipation shell further comprises a second through hole, the second through hole is formed in the second installation groove and corresponds to the first through hole; and after the extension end passes through the second through hole and the first through hole, the convex block is clamped into the neck so that the magnet is installed in the second installation groove.

6. The wireless charging power bank according to claim 1, wherein the wireless charging power bank further comprises a cover plate, and the cover plate is connected with the shell through a third connection assembly; the heat dissipation shell further comprises a second installation groove; and the shell comprises a first installation groove.

7. The wireless charging power bank according to claim 6, wherein the third connection assembly comprises a first convex shaft arranged on the cover plate and a hollow second convex shaft arranged on the shell, one side of the first convex shaft is provided with a protruding second fixture block, the first convex shaft is inserted into the hollow second convex shaft, the second fixture block is clamped into an inside wall of the shell, so that the cover plate is installed on the shell; and a surface of the cover plate is provided with a plurality of strip bulges.

8. The wireless charging power bank according to claim 7, wherein an inside edge of the cover plate is provided with a plurality of second connectors, and one side of the second connector is provided with a third fixture block; a second connecting hole is formed in the second installation groove, a third connecting hole corresponding to the second connecting hole in position is formed in the first installation groove, the second connector is inserted in the second connecting hole and the third connecting hole, and the third fixture block is clamped into the inside wall of the first shell.

9. The wireless charging power bank according to claim 1, wherein the shell comprises a first shell and a second shell that are detachably connected, the shell further comprises a fourth connection assembly, and the first shell is connected with the second shell through the fourth connection assembly.

10. The wireless charging power bank according to claim 9, wherein the fourth connection assembly comprises a third connector arranged on the second shell and a fourth connecting hole formed in the first shell, one end of the third connector comprises a third fixture block, the first shell comprises a first slot, and the fourth connecting hole is formed in the first slot; the third connector is inserted in the first slot, and the third fixture block is clamped in the fourth connecting hole so that the first shell is connected with the second shell; and the third fixture block gets away from the fourth connecting hole so that the second shell is detached from the first shell.

11. The wireless charging power bank according to claim 1, wherein the shell comprises a first installation groove; the heat dissipation shell comprises a second installation groove; and the wireless charging power bank further comprises a control circuit board, and the control circuit board is arranged in the shell and electrically connected with the battery.

12. The wireless charging power bank according to claim 11, wherein the first installation groove comprises a first conductor hole, the second installation groove comprises a second conductor hole, the first conductor hole corresponds to the second conductor hole in position, and the coil passes through the first conductor hole and the second conductor hole to be electrically connected with the control circuit board.

13. The wireless charging power bank according to claim 11, wherein the control circuit board comprises an indicator light; and a notch is formed in the position, corresponding to the indicator light, of the shell.

14. The wireless charging power bank according to claim 11, wherein the control circuit board further comprises a power interface.

15. The wireless charging power bank according to claim 11, wherein the shell is provided with a power button, and the power button is electrically connected with the control circuit board.

16. The wireless charging power bank according to claim 1, wherein the wireless charging power bank further comprises heat insulation boards, and the heat insulation boards are arranged on both sides of the battery; and the heat insulation board is made of aerogel.

17. The wireless charging power bank according to claim 1, wherein the heat dissipation shell is connected to the shell through a connection assembly; the fifth connection assembly comprises a locating slot formed in the heat dissipation shell and an elastic member arranged on the shell, one end of the elastic member is tilted outward, and one end of the elastic member is clamped into the locating slot so that the heat dissipation shell is installed on the shell.

18. A wireless charging power bank, comprising a shell, a heat dissipation shell, a battery and a coil, wherein the battery is installed on the shell; the coil is electrically connected to the battery for wirelessly charging an external device, the heat dissipation shell is installed on the shell and connected to the coil for conducting heat generated by the coil to the outside;

wherein the wireless charging power bank further comprises a magnet, and the magnet is used for adsorbing an external device; the magnet is connected with the shell through a second connection assembly; the heat dissipation shell further comprises a second installation groove, and the magnet is configured inside the second installation groove; and the shell comprises a first installation groove; and wherein the second connection assembly comprises a convex block arranged on the magnet and a neck arranged on the shell, the magnet comprises an extension end, the convex block is arranged on the extension end, the shell comprises a first through hole, and the first through hole is formed in the first installation groove; the heat dissipation shell further comprises a second through hole, the second through hole is formed in the second installation groove and corresponds to the first through hole; and after the extension end passes through the second through hole and the first through hole, the convex block is clamped into the neck so that the magnet is installed in the second installation groove.

* * * * *